(12) United States Patent
Seitsinger et al.

(10) Patent No.: US 6,418,063 B1
(45) Date of Patent: Jul. 9, 2002

(54) MEMORY ARCHITECTURE AND SYSTEMS AND METHODS USING THE SAME

(75) Inventors: Stephen Earl Seitsinger, Plano; Wayland Bart Holland, Dallas, both of TX (US)

(73) Assignee: Silicon Aquarius, Inc.

( * ) Notice: Subject to any disclaimer, the term of this patent is extended or adjusted under 35 U.S.C. 154(b) by 0 days.

(21) Appl. No.: 09/543,241

(22) Filed: May 14, 1999

Related U.S. Application Data

(62) Division of application No. 08/992,416, filed on Dec. 17, 1997, now Pat. No. 5,940,329.

(51) Int. Cl.[7] .............................................. G11C 16/04
(52) U.S. Cl. ............................ 365/189.05; 365/189.08; 365/230.06
(58) Field of Search ..................... 365/189.05, 230.03, 365/189.08, 205, 207, 230.06, 239, 190

(56) References Cited

U.S. PATENT DOCUMENTS

| | | | |
|---|---|---|---|
| 5,367,488 A | * 11/1994 | An .......................... | 365/189.01 |
| 5,828,594 A | * 10/1998 | Fuji ........................... | 365/63 |
| 5,886,943 A | * 3/1999 | Sekiguchi et al. ..... | 365/230.03 |
| 6,130,852 A | * 10/2000 | Ohtani et al. .......... | 365/230.03 |

* cited by examiner

*Primary Examiner*—Richard Elms
*Assistant Examiner*—Hien Nguyen
(74) *Attorney, Agent, or Firm*—James J. Murphy; Winstead Sechrest & Minick

(57) ABSTRACT

A memory architecture 400 includes an array of memory cells partitioned into a plurality of subarrays 401. Each subarray 401 includes a plurality of memory cells organized in rows and columns, each row associated with a conductive wordline 407 and each column associated with a pair of conductive half-bitlines 403. The first sense amplifier 402 is selectively coupled to selected pair of half-bitlines 403. A second sense amplifier 402 is selectively coupled to the selected pair of half-bitlines 403. A first local I/O line 404 is coupled to first sense amplifier 402 and a second local I/O line 404 is coupled to the second sense amplifier 402. First and second sets of global I/O lines 405 are selectively coupled to the first and second I/O lines 404.

18 Claims, 10 Drawing Sheets

US 6,418,063 B1

MEMORY ARCHITECTURE AND SYSTEMS AND METHODS USING THE SAME

This application is a division of application Ser. No. 08/992,416 filed Dec. 17, 1997 now U.S. Pat. No. 5,940,329.

TECHNICAL FIELD OF THE INVENTION

The present invention relates in general to electronic circuits and systems and in particular to a memory architecture and systems and methods using the same.

BACKGROUND OF THE INVENTION

Dynamic random access memories (DRAMs) typically include an array of rows and columns of memory cells, each row associated with a conductive wordline and each physical column with a conductive bitline. The array is normally partitioned into a number of subarrays to efficiently access the cells. For addressing purposes, a "column" is one or more physical columns of cells which are addressed and accessed at once (e.g. in a "by 16"" device, a column is 16 physical columns wide). By appropriate addressing of the rows and columns, data can be read and written into a predetermined cell or set of cells.

Consider the case of a read to a subarray (a write is basically the same with the data flow reversed). Row addressing circuitry, in response to a row address, activates the conductive wordline containing the data to be accessed. In turn, the pass transistors (transfer gates) of all memory cells along the row are activated thereby coupling the capacitor of each of these cells to their associated bitline, all of the bitlines in the subarray having been previously precharged to a predetermined voltage. As a result, a small positive or negative voltage shift from the precharge voltage occurs on each bitline, depending on the voltage stored on the capacitor of the associated cell. Sense amplifiers sense the voltage change on each bitline and latch each bitline to a corresponding logic high or logic low voltage. Words of one or more cells, depending on the column width, can then be output by a column decoder coupled to the sense amplifiers and associated bitlines. There are various ways in which data can be output from the column decoder during a read, including: random, page, serial and burst accesses. Briefly, during a random access a single word of data from a single addressable column along the active row is passed to the DRAM output by the column decoder. Once the word is output, a new access to the array is initiated with a new row address. During a page access, a row is selected with a row address and a first word is accessed using a first column address, typically input from an external source. Then, while the same row remains active, additional column addresses, generated either internal or external to the DRAM, are used to access additional words from that row. In a page access, these data do not have to be accessed from adjacent columns along the active row. During a serial access, data from the sense amplifiers are serialized and then clocked out of the DRAM using a single output pin.

In a burst access, a row is again selected as described above and the stored data along that row correspondingly latched into the sense amplifiers. One or more bits are set in a mode register defining a burst length in number of words. From a given starting column address, adjacent columns are sequentially accessed by the column decoder in response to a clock until the entire burst of words defined by the burst length is accessed.

Burst accessing is an important feature in many types of DRAMs, and in particular synchronous DRAMs (SDRAMs). Unfortunately, currently significant problems are encountered during the design and implementation of DRAMs with burst mode capability. Among other things, it currently is not possible to access data from the same subarray at high or very high data rates. This can significantly put restrictions on minimizing burst access time and consequently limits the usefulness of current DRAMs in high speed applications.

Thus, the need has arisen for an improved architecture for implementing DRAMs with high speed access capability. In particular, the present restrictions on very high speed bursting from a subarray should be addressed.

SUMMARY OF THE INVENTION

According to a first embodiment of the principles of the present invention, a memory architecture is disclosed which includes an array of memory cells partitioned into a plurality of subarrays. Each subarray includes a plurality of memory cells organized in rows and columns, each row associated with a conductive wordline and each column associated with a pair of conductive half-bitlines. First and second sense amplifiers are selectively coupled to a selected pair of half-bitlines. A first I/O line is coupled to the first sense amplifier and a second I/O line is coupled to the second sense amplifier. First and second sets of global I/O lines, are each selectively coupled to the first and second local I/O lines.

According to a second embodiment of the principles of the present invention, memory is provided including an array of rows and columns of memory cells, each row controlled by a first conductor and each column controlled by a second conductor. A plurality of sense amplifiers is coupled to a corresponding one of the second conductors. Also included are at least one input/output line and at least one transfer gate for selectively coupling an output of a selected one of the sense amplifiers to the input/output line, the transfer gate operable in response to a control signal associated with the selected sense amplifier. Latches coupled to the input/output line for latching data output from the selected sense amplifier is presented on the input/output line in a response to a control signal.

According to a third embodiment of the principles of the present invention, a memory is disclosed which includes a first memory cell coupled to a wordline and a first bitline and a second memory cell coupled to the wordline and a second bitline. First and second sense amplifiers are each coupled to the first and second bitlines. A third sense amplifier is selectively coupled to the second sense amplifier by a third bitline for copying data received from the second sense amplifier. A first read amplifier is selectively coupled to the third sense amplifier for outputing data transferred from the first memory cell by the second and third sense amplifiers. A second read amplifier is selectively coupled to the third sense amplifier outputting data transferred from the second memory cell by the first, second, and third sense amplifiers.

The principles of the present invention are also embodied in methods for storing and retrieving data. In one such embodiment, a method of bursting data from first and second memory cells is disclosed, the first memory cell coupled to a wordline and a first bitline and the second memory cell coupled to the wordline and a second bitline. The wordline is asserted, and first data stored in the first cell is latched with a first sense amplifier selectively coupled to the first bitline. Second data, stored in the second cell, is latched with a second sense amplifier selectively coupled to the second bitline. The first data latched in the first sense amplifier is copied into a third sense amplifier coupled to the first sense amplifier by a third bitline. The data copied into third sense amplifier is transferred to peripheral circuitry. The second data latched in the second sense amplifier is copied into a fourth sense amplifier through a fourth bitline. The second data copied into the fourth sense amplifier is transferred to the peripheral circuitry.

According to another method embodying the principles of the present invention, a method of bursting data in a multiple subarray memory is disclosed, where each subarray is arranged in rows and columns with each column of cells coupled to a conductive bitline and each bitline selectively coupled to first and second sense amplifiers. First and second sets of input/output lines are precharged. Data from first and second memory cells with the subarray are latched through the corresponding first and second bitlines of the subarray into first and second sense amplifiers. The data latched in the second sense amplifier is copied into a third sense amplifier. Data from the first cell is accessed using the first sense amplifier and the first set of input/output lines. Data from the second cell is accessed using the third sense amplifier and the second set of input/output lines.

In an additional embodiment of the present invention, memory is disclosed including an array of rows and columns of subarrays, each subarray including a plurality of rows and columns of memory cells, with each column of cells associated with a bitline and each bitline coupled to first and second sense amplifiers. Circuitry is provided for coupling the bitlines of a selected subarray, a column of subarrays to peripheral circuitry through the bitlines of a second subarray of the column. Circuitry is also provided for selectively activating a set of the sense amplifiers coupled to the bitlines of the first and second subarrays.

In two further embodiments of the principles of the present invention, a memory is disclosed which includes an array of rows and columns of sense amplifiers. Circuitry is provided for selectively coupling an I/O port of a selected sense amplifier of a selected column with an I/O line in response to a control signal. Circuitry is also provided for selectively coupling a control signal from a column line to the circuitry for selectively coupling an I/O port to the I/O line.

The principles of the present invention have substantial advantages over the prior art. Among other things, two accesses can sequentially be made to the same subarray per array during a single RAS cycle. This capability is not available in the current art. Applying the principles of the present invention allows for the design and fabrication of DRAMs with high-speed access capability and in particular, DRAMs with very high speed bursting capability.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–9 of the drawings, in which like numbers designate like parts.

Figure 1:
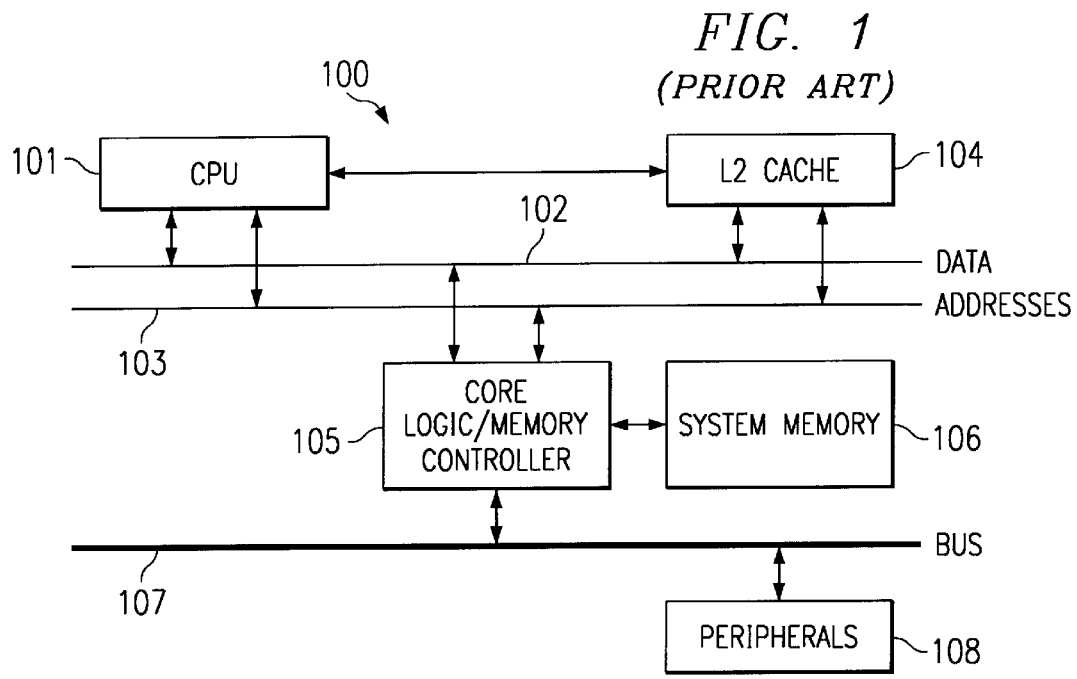
FIG. 1 is a block diagram depicting a basic system architecture 100 typical of that found in personal computers (PCs)

FIG. 1 is a block diagram depicting a basic system architecture 100 typical of those found in personal computers (PCs). While numerous variations on this basic architectures exist, FIG. 1 is suitable for describing the basic structure and operation of most PCs.

Systems 100 includes a single central processing unit 101, CPU local data bus 102, CPU local address bus 103, external (L2) cache 104, core logic/memory controller 105, and system memory 106. In system 100, the peripherals 108 are coupled directly to core logic/memory controller 105 via a bus 107. Bus 107 in this case is preferably a peripheral controller interface (PCI) bus, although alternatively it could be an ISA, general, or special purpose bus, as known in the art.

In single CPU systems 100, CPU 101 is the "master" which, in combination with the operating system and applications software, controls the overall operation of system 100. Among other things, CPU 101 performs various data processing functions including numerical and word processing, generates graphic data, and performs overall system management. CPU 101 may be for example a complex instruction set computer (CISC), such as an Intel Pentium class microprocessor, a reduced instruction set computer (RISC), such as a Apple PowerPC microprocessor, or a very long instruction word (VLIW) machine.

CPU 101 communicates with the remainder of system 100 via CPU local address and data buses 102 and 103, each of which may be for example a special bus, or a general bus, as known in the art.

Core logic/memory controller 105, under the direction of CPU 101, controls the exchange of data, addresses, control signals and instructions between CPU 101, system memory 105, and peripherals 108/107. Although the core logic/memory controller allows tasks to be shifted from the CPU, thereby allowing the CPU to attend to other CPU-intensive tasks, the CPU can always override core logic/memory controller 105 to initiate execution of a higher priority task.

Core logic and memory controllers are widely available in the PC industry and their selection and application are well known by those skilled in the art. The memory controller can be either a separate device or incorporated into the same chip sat as the core logic. The memory controller is generally responsible for generating the memory clocks and control signals such as /RAS, /CAS, R/W and bank select, and monitors and controls cell refresh. The memory controller may also have some address generation capability for accessing sequence of pages.

The core logic is typically comprised of a chip-set, with one or more chips typically being "address and system controller intensive" and one or more chips typically being "data intensive." Among other things, the address intensive chip(s): interfaces CPU 101 with address bus 103; maintains cache memory, including the cache tags, set associative cache tags and other data necessary to insure cache coherency; performs cache "bus snooping"; generates the control signals required for DRAMs in the system memory or cache; and controls general management transactions. The data intensive chip(s) generally: interfaces CPU 101 with the data bus 102; issues cycle completion responses; may abort operations if their cycles are incomplete; and arbitrates for the data path of bus 102.

CPU 101 can directly communicate with core logic/memory controller 105 or with external (L2) cache 104 via address bus 103 and data bus 102. L2 cache 104 may be for example a 256 KByte fast SRAM device(s). Typically, the CPU also maintains up to 16 kilobytes of on-chip (L1) cache.

Peripherals 108 may include a display controller and associated frame buffer, floppy drive controller, disk driver controller, and/or modem, to name only a few options.

Figure 2:
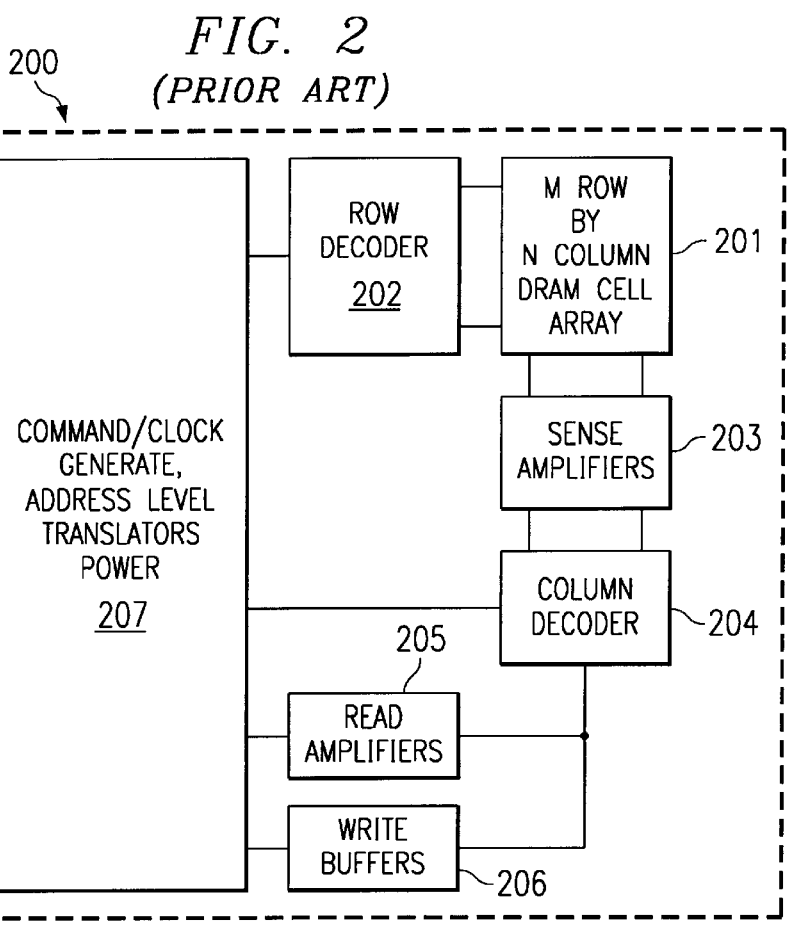
FIG. 2 is a block diagram of an exemplary DRAM.

FIG. 2 is a high level functional block diagram of a typical DRAM memory 200 suitable for such applications as the construction of system memory 106. Memory 200 includes an array 201 of rows and columns of DRAM cells. A row of cells in array 201 is selected in response to a received row address by row decoder 202 which activates the conductive wordline coupled to the cells of the selected row. Each column of cells is associated by a conductive bitline consisting of a pair of complementary bitlines. Each pair of half-bitlines is coupled to a corresponding sense amplifier 203. During a read, the data from an entire row of cells are sensed and latched by sense amplifiers 203. Subsequently, column decoder 204, in response to a received column address, selectively passes a set of the desired data from the row of data latched in sense amplifiers 203. A write operation is similar.

The selected data passed by column decoder 204 during a read operation is driven to the memory input/output (I/O) port DQ0–DQZ by a set of read amplifiers 205. During a write, write buffers 206 drive received data from the I/O port through the column decoder (which selects the bitlines of the cells to be written) and the sense amplifiers to array 201.

Block 207 generally shows the input/output circuitry, address latches, and clock generation circuitry typical in most DRAMs. In the illustrated embodiment, a multiplexed address bus is coupled to port ADD0–ADDY from which row addresses are latched-in with the row address strobe (/RAS) and column addresses with the column address strobe (/CAS). /RAS also controls the timing of the pre-charge and active cycles of DRAM 200. The write enable (/WE) and output enable (/OE) control the input and output of data through the data port DQ0–DQZ. If DRAM 200 is a synchronous DRAM, the CLOCKS will include the synchronous DRAM master clock.

Figure 3:
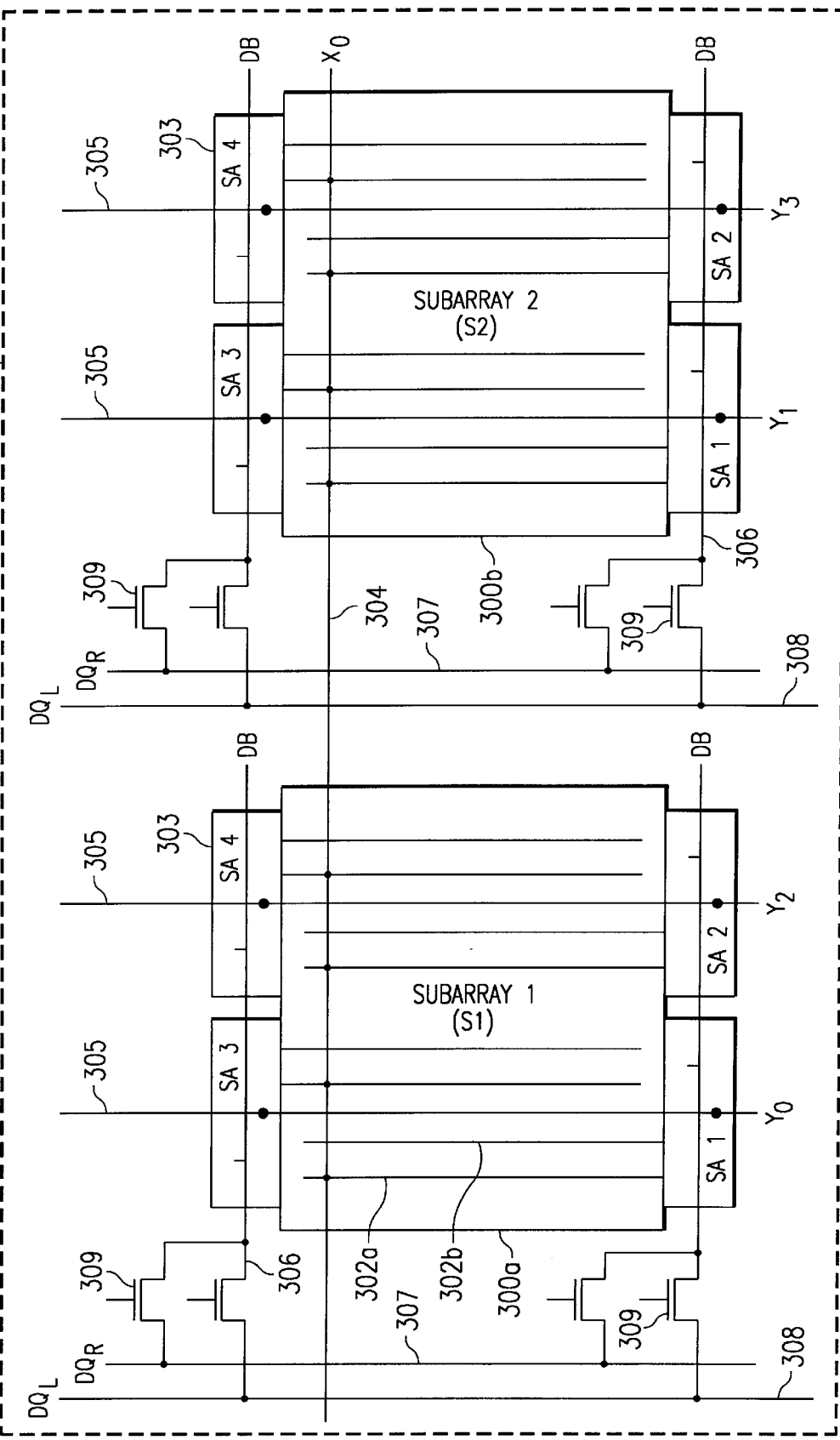
FIG. 3 is a high level diagram of a pair of adjacent memory cell subarrays in the array shown in FIG. 2.

FIG. 3 is a high level diagram of a pair of adjacent memory cell subarrays 300a and 300b (collectively designated 300) of DRAM array 201. Each subarray includes a plurality of half-bitlines 302a, each paired with a complementary half-bitline 302b (each pair collectively a bitline). Each half-bitline pair 302a–302b is coupled to a single sense amplifier 303. It should be noted that only a very few sense amplifiers and bitlines are shown in the FIGURES hereto for brevity and clarity. In actual practice, the number of rows and columns of cells, bitlines and sense amplifiers per subarray will be substantially larger.

A typical access to subarrays 300 can briefly be described as follows. Row and column addresses are received and latched into the data latches within block 207 in response to /RAS (the row address strobe) and /CAS (the column address strobe), respectively. The row address is decoded by row decoder 202 and a selected row within array 201 is activated, in this example row Xo (304, FIG. 3).. Sense amplifiers 203/303, both above and below subarrays 300, then sense and latch a page of data (i.e. the data from all cells along row Xo). In this example, half of the half-bitline pairs have their sense amplifiers above the subarray and the other half of the half-bitline pairs have their sense amplifiers below the subarray. For example, in subarray S1, half of the bitlines are coupled to sense amplifiers $SA_1$ and $SA_2$ and half to $SA_3$ and $SA_4$.

Next, the column address is decoded by column decoder 204 and used to drive a selected column line (305, FIG. 3) Yi, assume for example column line Yo. With the activation of column line Yo, the data in sense amplifiers $SA_1$ and $SA_3$ of subarray S1 (300a) are presented on the corresponding local I/O line DB (306) above and below the subarray, respectively. The data from sense amplifier $SA_1$ is the presented on one of the associated pair of global I/O lines $DQ_R$ or $DQ_L$ (308) and the data held in sense amplifier $SA_3$ is presented on the other line of the DQ pair 308.

According to the 2N Rule, with a burst length of 2, 2 bits of data are accessed per I/O pin with each column address. For example, if the initial column address accesses a location (word) at column address A0, then the location at column address A0+1 is automatically sequentially accessed through the same I/O pins. If the burst length is 3, then three words are automatically sequentially accessed per initial column address, and so on.

In the present example, where the initial column line activated was $Y_0$, column line $Y_1$ is next activated and data from sense amplifier $SA_1$ and $SA_3$ of subarray $SA_2$ (300b) are read-out through the I/O lines DB 306 associated with subarray S2. At the same time the I/O lines DB (306) associated with subarray S1 (300a) are precharged and prepared for use in the next cycle.

As long as data is read out of alternating subarrays this traditional scheme will work; however, when two sequential accesses are required from the same subarray, the scheme fails.

Consider the case where the desired column line 305 activation sequence is Y0, Y2 followed immediately by Y1, Y3. This sequence requires two successive accesses to subarray S1 followed by two successive accesses to subarray S2 in the same /RAS cycle. This in turn demands that both the lower and upper data (DB) lines for subarray S1 be successively used to access data from sense amplifiers $SA_1$ and $SA_3$, when column line Y0 is activated, and then from serise amplifiers $SA_2$ and $SA_4$, when column line Y2 is activated. The same is true for subarray S2. This case demands that both the lower and upper local I/O lines first be used to access the data in subarray S2 sense amplifiers $SA_1$ and $SA_3$, when column line Y1 is activated, and then from sense amplifiers $SA_2$ and $SA_4$, when column line Y3 is activated.

The second access to each subarray (i.e. from the corresponding sense amplifiers $SA_2$ and $SA_4$) cannot be performed in the traditional scheme and still insure that the appropriate data is output to the periphery. Specifically, for either subarray S1 or S2, after the access to sense amplifiers $SA_1$ and $SA_3$ has been performed, the local data (DB) lines remain in the state latched by sense amplifiers $SA_1$ and $SA_3$. In the single /RAS cycle scenario, the data in sense amplifiers $SA_2$ and $SA_4$ of the corresponding subarray S1 or S2 are lost since no precharge of local I/O (DB) occurred immediately after the access to $SA_1$ and $SA_3$ of that subarray. In other words, it is impossible to sequentially access the same array during a single (/RAS) burst cycle. This problem also occurs when random start addresses are used to access any column along the selected row.

Figure 4A:
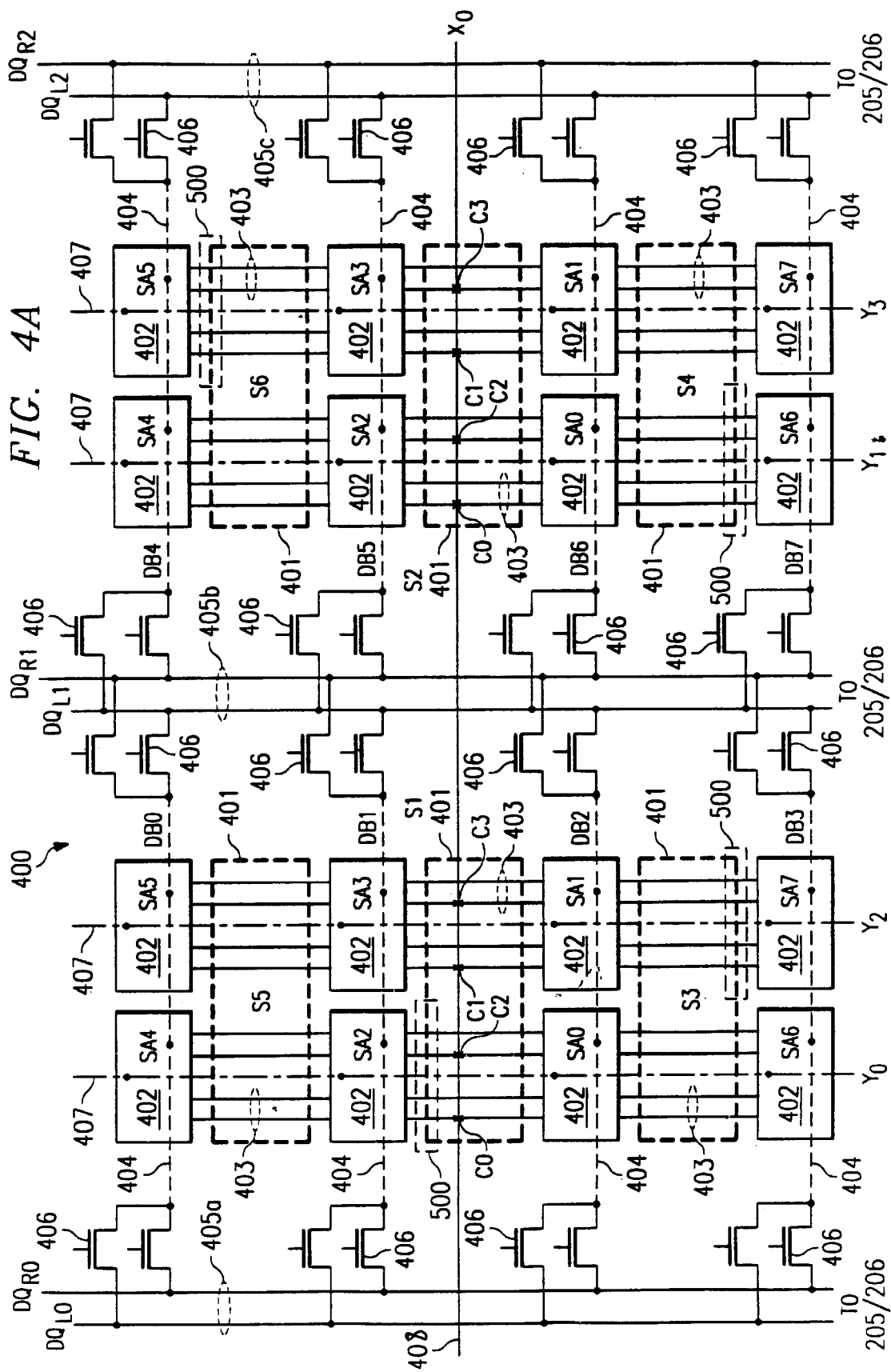
FIG. 4A is a multiple subarray architecture embodying the principles of the present invention.

These substantial disadvantages are overcome by application of the principles of the present invention. Specifically, FIG. 4A is an exemplary subarray architecture 400 embodying these principles. In the illustrated embodiment, architecture 400 includes six subarrays 401, organized as two columns of three and respectively labelled S1–S6. Each subarray 401 is associated with both upper and lower sets of sense amplifiers 402, with the sense amplifiers of each column of subarrays 400 labeled $SA_0$–$SA_7$, as shown in the figure. The number and organization of subarrays 401 and sense amplifiers 402 may vary from application to application.

Each row of sense amplifiers (SAx) 402 are connected to a local data I/O line DBz (404), which in turn can be selectively coupled to a given set of global I/O lines $DQ_L$ and $DQ_R$ (405) through pass transistors 406. Columns of sense amplifiers are controlled by column lines Y0–Y3 (407). A single wordline 408 (X0) is shown for discussion.

According to the principles of the present invention, the half-bitline pairs 403 of each subarray 401 are each coupled to two sense amplifiers 402, preferably above and below the subarray, through a set of isolation transistors (500). For example, one selected set of half-bitlines 403 in subarray S1 are coupled to both sense amplifiers $SA_0$ and $SA_2$ while a second selected set of half-bitlines of subarray S1 are coupled to both sense amplifiers $SA_1$ and $SA_3$. A similar arrangement of subarrays, sense amplifiers and half-bitlines is used across array 400.

Figure 4B:
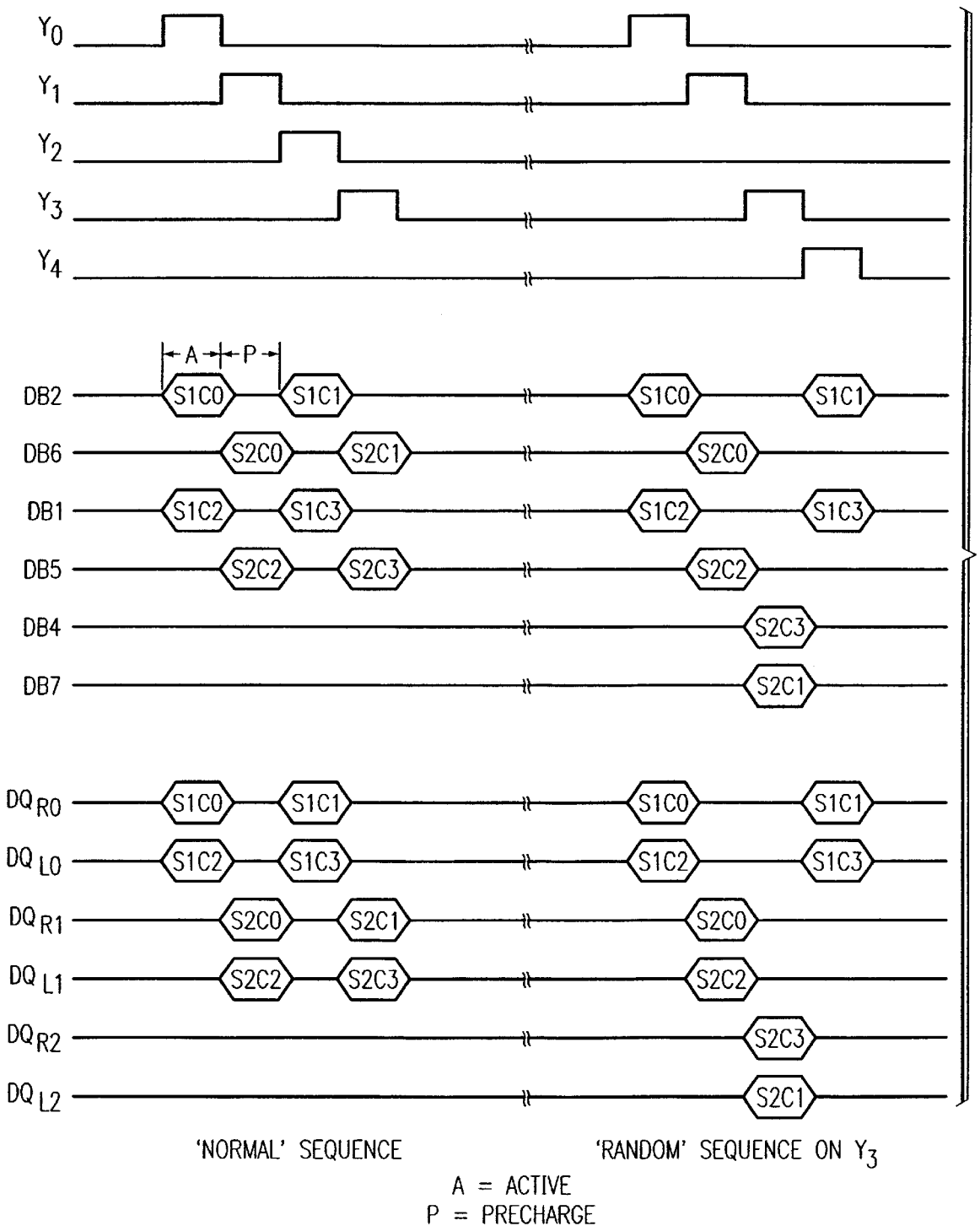
FIG. 4B is a timing diagram illustrating a typical operation of the architecture of FIG. 4A.
Figure 5:
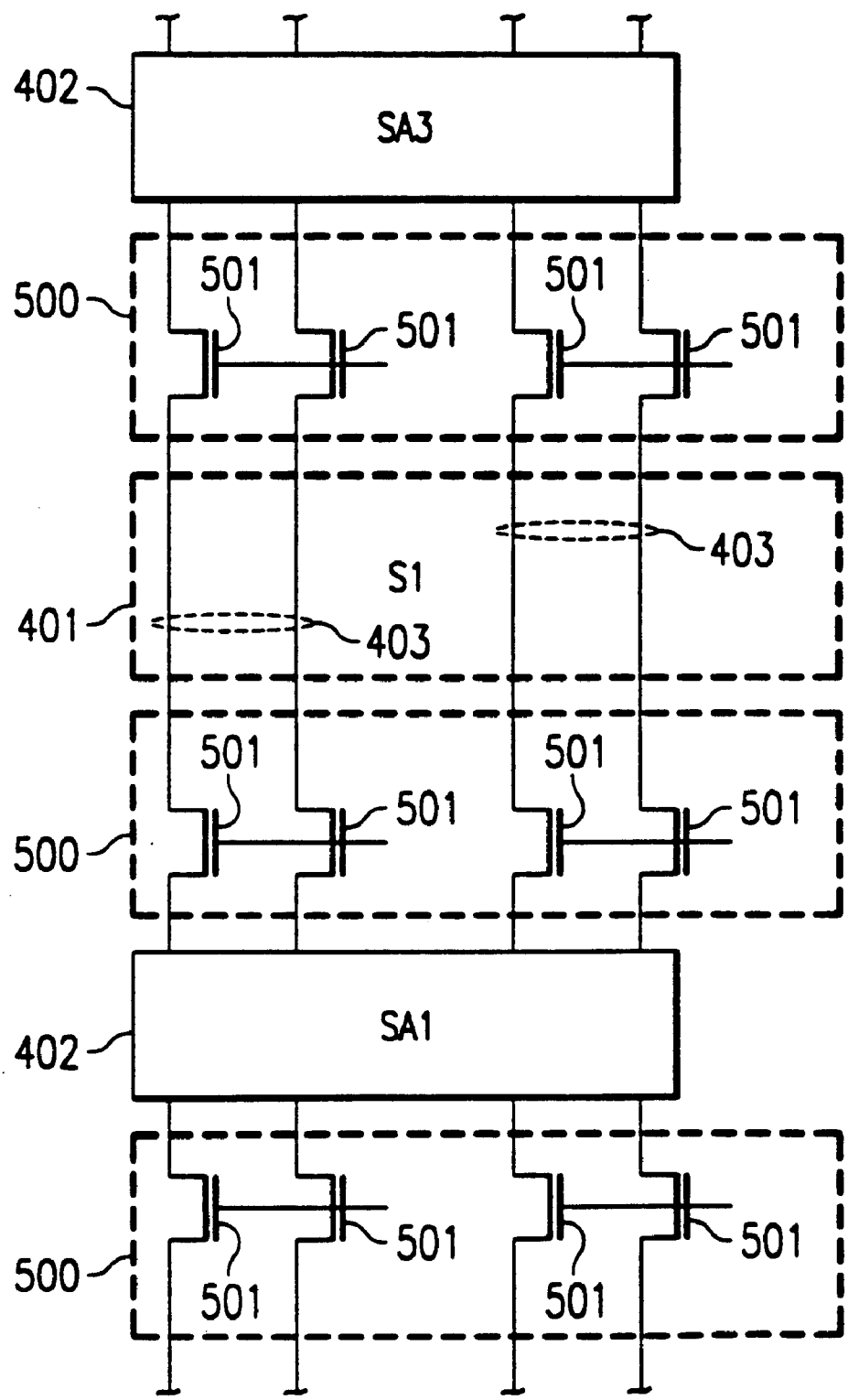
FIG. 5 is a detailed diagram of exemplary instances of the inventive double sense amplifier per half-bitline pair approach of FIG. 4.

FIG. 5 is a detailed diagram of the novel structure shown generally for exemplary instances in FIG. 4 at 500. In FIG. 5, two sense amplifiers 402 ($SA_1$, $SA_3$) and adjacent pairs of half-bitlines 403 and a subarray 401 (S4) are depicted. Note that each pair 403 of half-bitlines are selectively coupled to both sense amplifiers $SA_1$ and $SA_3$ via transistors 501. In other words and in contrast to the architecture of FIG. 3, in the architecture shown in FIGS. 4A and 5, an additional selectable connection is made as shown at 500 to effectuate a double sense amplifier per half-bitline pair approach.

The operation of the architecture shown in FIGS. 4A and 5 can now be described with reference to the timing diagram of FIG. 4B. For illustrative purposes a read operation will be described, although a write operation is substantially similar.

In response to a row address, one row of cells is selected and the corresponding wordline 407 pulled to a logic high voltage. For this example, the selected wordline is wordline $X_0$ depicted in FIG. 4A. Wordline assertion occurs after the sense amplifiers coupled immediately above and below wordline $X_0$ have been prepared and the corresponding bitlines precharged. In this case, the bitlines of subarrays S1 and S2 are precharged and sense amplifiers $SA_0$–$SA_3$ associated with each subarray S1 and S2 are prepared for a read operation. Selected cells along wordline $X_0$ are shown for each subarray 401 and designated Cj.

A burst read operation, including sequential accesses to the same subarray can now be described. First, data from the cells along selected row $X_0$ are latched into the corresponding sense amplifiers for the given subarrays controlled by that wordline. For illustration, assume that bits are placed in the corresponding sense amplifiers as follows:

| Accessed cell | Sense Amplifier |
| --- | --- |
| $(S_iC_j)$ | $(S_iSA_k)$ |
| $S_1C_0$ | $S_1SA_0$ |
| $S_1C_2$ | $S_1SA_2$ |
| $S_1C_1$ | $S_1SA_1$ |
| $S_1C_3$ | $S_1SA_3$ |
| $S_2C_0$ | $S_2SA_0$ |
| $S_2C_2$ | $S_2SA_2$ |
| $S_2C_1$ | $S_2SA_1$ |
| $S_2C_3$ | $S_2SA_3$ | where: $S_i$ represents the subarray, $C_j$ represents a cell along the selected row within subarray $S_i$, and $SA_k$ represents the sense amplifier latching the data from cell $C_j$ of subarray $S_i$.

Then for example, while the sense amplifiers $S_1SA[0:3]$ and $S_2SA[0:33]$ are driving their respective bitlines 403, the data are also copied into sense amps $S_1SA[4:7]$ and $S_2SA[4:71]$, follows:

| Accessed cell | Reading Sense Amplifier | Copying Sense Amplifier |
| --- | --- | --- |
| $(S_iC_j)$ | $(S_iSA_k)$ | $(S_iSA_k)$ |
| $S_1C_0$ | $S_1SA_0$ | $S_1SA_6$ |
| $S_1C_2$ | $S_1SA_2$ | $S_1SA_4$ |
| $S_1C_1$ | $S_1SA_1$ | $S_1SA_7$ |
| $S_1C_3$ | $S_1SA_3$ | $S_1SA_5$ |
| $S_2C_0$ | $S_2SA_0$ | $S_2SA_6$ |
| $S_2C_2$ | $S_2SA_2$ | $S_2SA_4$ |
| $S_2C_1$ | $S_2SA_1$ | $S_2SA_7$ |
| $S_2C_3$ | $S_2SA_3$ | $S_2SA_5$ |

Thus, the entire row of bits along Xo are now contained in two sets of sense amps.

Pass transistors 406 are next used to selectively couple the sense amplifiers with the corresponding global I/O lines DQ, $DQ_R$ (405) via local I/O lines DBz. FIG. 4B depicts read operations during a "normal access sequence" as well as a "random sequence on Y3." Each of these sequences will be discussed, beginning with the normal access sequence.

In an exemplary normal access cycle, Column line Y0 is asserted and the data from cells $S_1C_0$ and $S_1C_2$, latched in sense amplifiers $S_1SA_0$ and $S_1SA_2$, are output to global I/O lines $DQ_{R0}$ and $DQ_{L0}$ via local I/O lines $DB_1$ and $DB_2$. (This assignment of cells $S_1C_0$ and $S_1C_2$ to global I/O lines $DQ_{R0}$ and $DQ_{L0}$ is arbitrary for exemplary purposes, lines $DQ_{R0}$ and $DQ_{L0}$ could be revised, or another set of lines, such as $DQ_{R1}$, and $DQ_{L1}$, could be used, depending on the access scheme.

Next, column line Y1 is asserted allowing data to be transferred from cells C0 and C1 of subarray S2 to the DQ lines of Set 1, in a similar fashion using sense amplifiers $S_2SA_0$ and $S_2SA_2$. During the time array S2 is being accessed, the local I/O lines DB1 and DB2 of array S1 and the global I/O lines $DQ_{R0}$ and $DQ_{L0}$ can be precharged.

The same process is used as shown in FIG. 4B, with cells C1 and C3 of subarray S1 accessed through sense amplifiers $S_1SA_1$ and $S_1SA_3$, and cells C1 and C3 of subarray S2 accessed using sense amplifiers $S_2SA_1$ and $S_2SA_3$. Again, one set of I/O lines can be precharged while the other is accessed.

Thus, a burst of four, two bit words are read. The same process applies when wider words and/or longer bursts are required.

An exemplary burst access according the principles of the present invention wherein the arrays are accessed (read) in the sequence S1, S2 and S2 can now be described in detail.

The access to subarray S1 and the first access to subarray S2, as shown in FIG. 4B, follow the same procedure as described above using the Y0 and Y1 column lines and the corresponding sense amplifiers. With regards to the second access to subarray S2, the copying feature of the present invention is advantageously applied. Assume that global I/O line set 0 (405a) and local I/O lines DB1 and DB2 were used for the subarray S1 access and global I/O lines set 1 (405b) and local I/O lines DB5 and DB6 were used for the first access to subarray S2.

Assume that during the immediately preceding access, cells $S_2C_0$ and $S_2C_2$ were read using local I/O lines DB5 and DB6 and DQ line set 1. Since there is no time for precharge when consecutive accesses are made to the same subarray, none of these I/O lines are precharged and available.

Assume that cells $S_2C_1$ and $S_2C_3$ are being read during the second access to subarray S2. Column line Y3 is asserted. Using transistors 406, the bit in cell $S_2C_1$ is output from sense amplifier $S_2SA_7$ (recall that sense amplifier SA7 maintains a copy of the data latched in sense amplifier $SA_1$ during the first access to subarray S2) through local data line DB7 to one DQ line of DQ line set 2 (405c). Note that local I/O line DB7 and global DQ line set 2 (405c) $DQ_{L2}$, $DQ_{R2}$ were not used during the first access to subarray S2 and therefore are still in a precharged state. Similarly, the data from cell $S_2C_3$, which were copied into sense amplifier $S_2SA_5$, is output on already precharged local I/O line DB4 and the remaining global line of DQ of line set 2 ($DQ_{R2}$, $DQ_{L2}$).

A second access could similarly be made to subarray S1, without the need for an intervening precharge cycle. Recall that, in this example, the first access to subarray S1 was made to cells $S_1C_0$ and $S_1C_2$ using column $Y_0$, local I/O lines $DB_1$ and $DB_2$ and sense amplifiers $S_1SA$ and $S_1SA_1$. Hence, a second access during the same /RAS cycle, for instance to cells $S1C_1$, and $S1C_3$, could be made using sense amplifiers $S1SA_5$ and $S1SA_7$ and local DB lines $DB_0$ and $DB_3$.

Figure 6A:
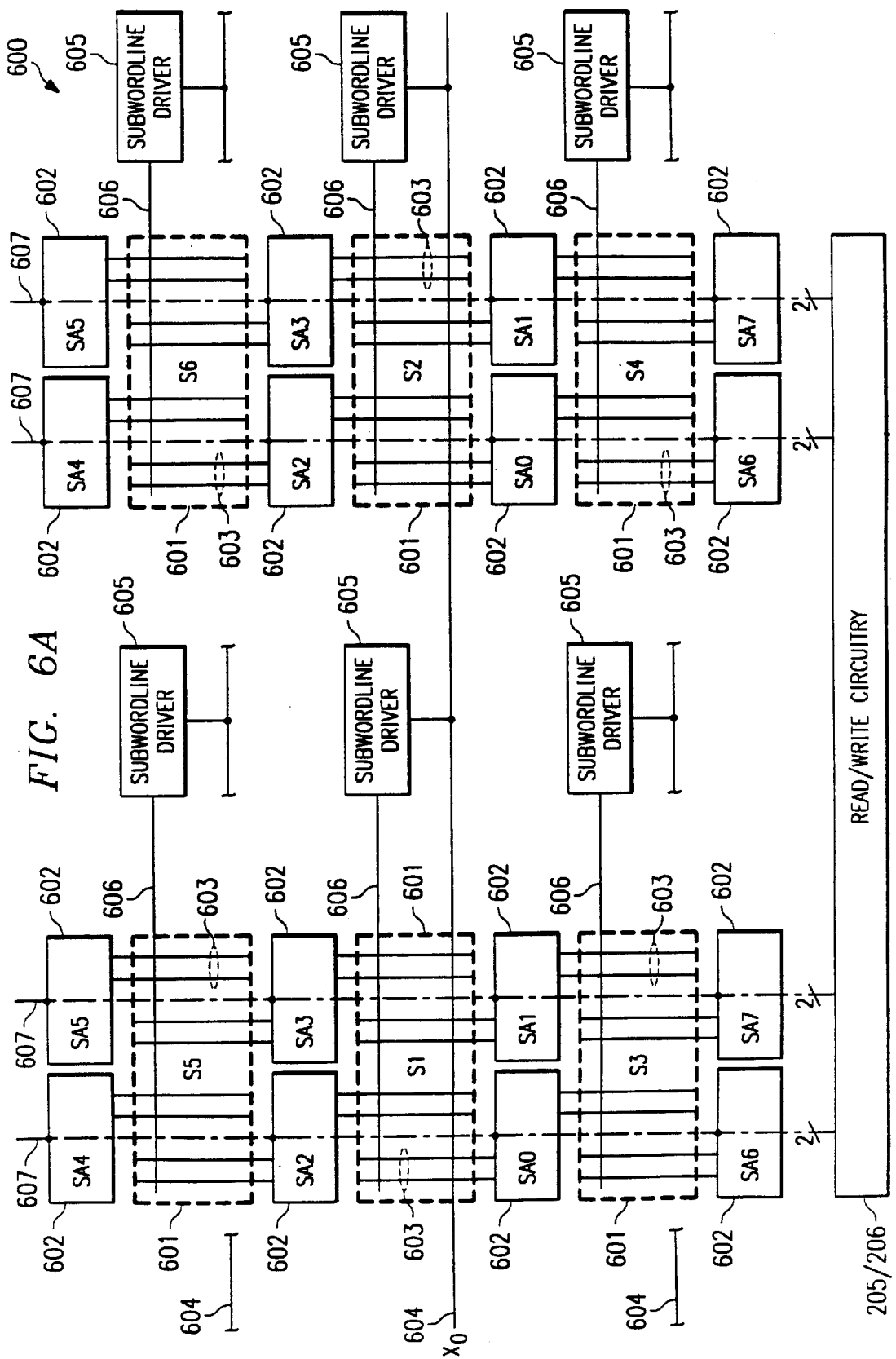
FIGS. 6A and 6B depict an alternative memory architecture according to the principles of the present invention.
Figure 6B:
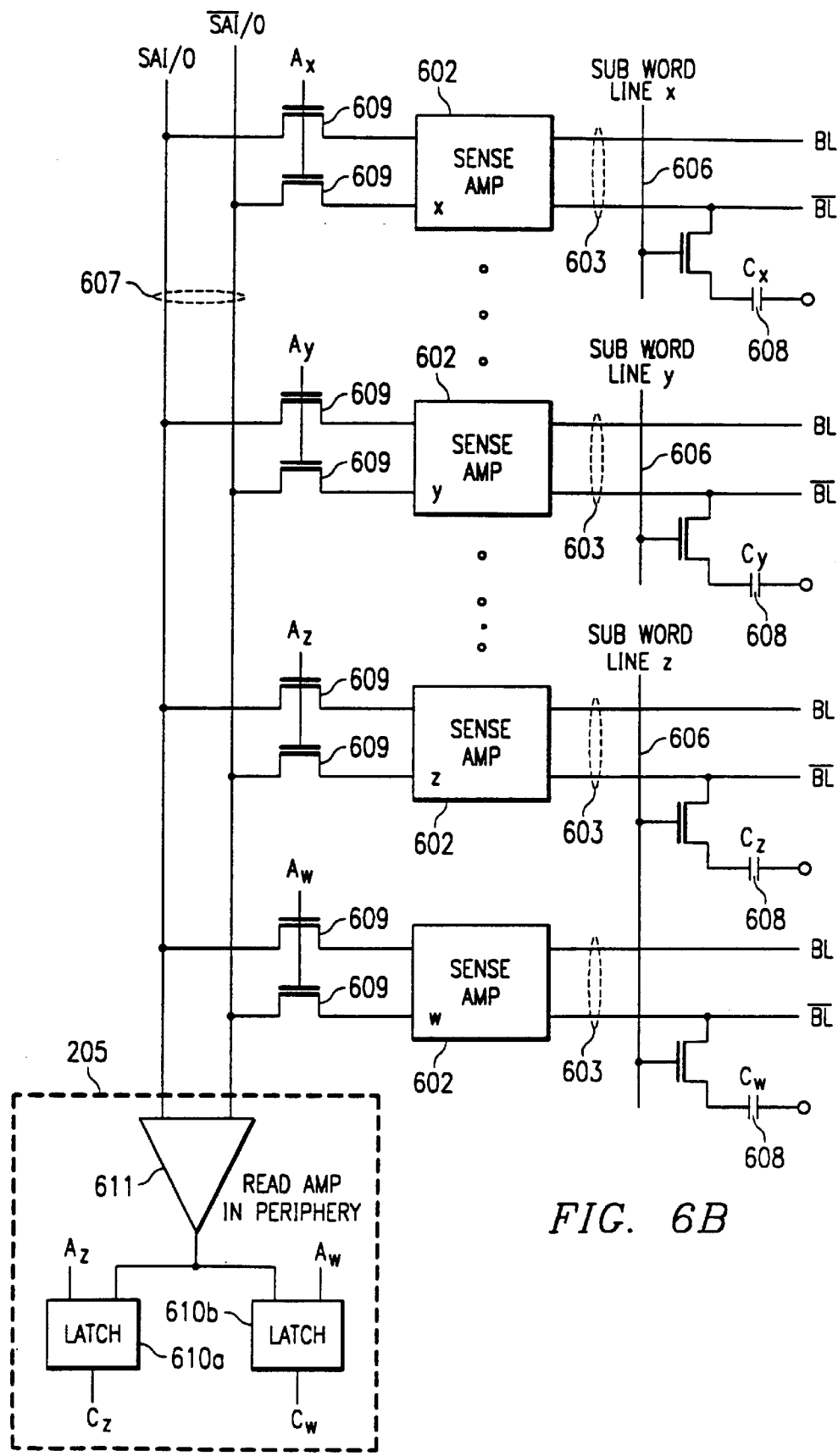

FIGS. 6A and 6B depict an alternative memory architecture according to the principles of the present invention. Advantageously, this embodiment will substantially reduce or eliminate memory core to periphery bottlenecks.

In the illustrated embodiment 600 of FIGS. 6A and 6B, subarrays 601 include half-bitline pairs 603 which are coupled to a single corresponding sense amplifiers 602 in a traditional fashion. It should be noted however, that the novel bitline-sense amplifier arrangement discussed above may also be used.

In FIG. 6A, row selection for each subarray 601 is controlled by a primary wordline 604, such as wordline X0, and a plurality of subwordlines 606 each coupled to a corresponding subwordline driver 606.

According to the principles of the present invention, the Y decode (column) signals are eliminated as the mechanism for bringing data from the memory core area to the peripheral area of the device. Instead the Y decode lines (407, FIG. 4A) are each are replaced by a pair of Sense Amplifier Input/Output (SAI/O) lines (conductors) 607. Preferably, SAI/O lines are disposed perpendicular to subword lines 606 and in parallel to half-bitline pairs 603. Each SAI/O line pair 607 is connected to all of the sense amplifiers 602 that lie along its path. In the illustrated embodiment of FIG. 6A, there is a SAI/O line pair 607 for every sense amplifier 602 that lies along a column extending from the read/write peripherals 205/206.

FIG. 6B shows selected SAI/O-sense amplifier interconnections in detail. As shown, each pair of SAI/O lines 607 is coupled to the corresponding sense amplifiers 602 through a pair of transistors 609. The gates of each pair of transistors 609 are controlled by lines AX,AY,AZ,AW respectively. Selected memory cells Cx–Cz, Cw are depicted for reference.

The operation of the embodiment shown in FIGS. 6A and 6B can now be described by the following exemplary read operation. Assume that in response to a row address subword line z (606) (FIG. 6B) selects a page of cells including bits Cz and Cw for transfer to the periphery area 205 of the device. Sense amplifiers z and w then sense the value of bits z and w from cells Cz and Cw respectively.

The data from cell Cz is then transferred to I/O lines SAI/O and /SAI/O by asserting line Az and activating the corresponding pair of transistors 609. (Signals Az, Ay, Az and Aw are asserted based upon the main word line 604 signal or the subword line signal and one other signal generated in the periphery.) At the same time signal Az enables latch 610a in the periphery 205 to receive the value of Cz from differential read amplifier 611. Signal Az is then deasserted.

Next, bit w from cell Cw is transferred to periphery 205 by asserting signal Aw in the same manner. In this case, latch 610b is enabled to receive the value of Cw from read amplifier 611. Aw is then deasserted.

One advantage of this embodiment is that an entire row or page of data is available in the periphery of the memory device after the input of the row address and before the input of the column address.

In alternative embodiments, a second layer of SAI/O lines 607 may be provided. In this case, one layer of SAI/O lines is connected to every other sense amplifier 602 in a column of sense amplifiers 602 and a second layer of SAI/O lines connected to the remainder. Advantageously, this alternate scheme will eliminate the need to multiplex SAI/O lines between one of two sense amps as was done above. This scheme will advantageously also cause the entire page of bits to be transferred to the periphery circuits in one half the time required by multiplexed SAI/O lines.

Alternatively, each SAI/O line coupled to a corresponding column of single sense amplifiers (non-multiplexed) or one of two sense amplifiers (multiplexed) in the periphery would reduce the number of read amplifiers required.

Figure 7:
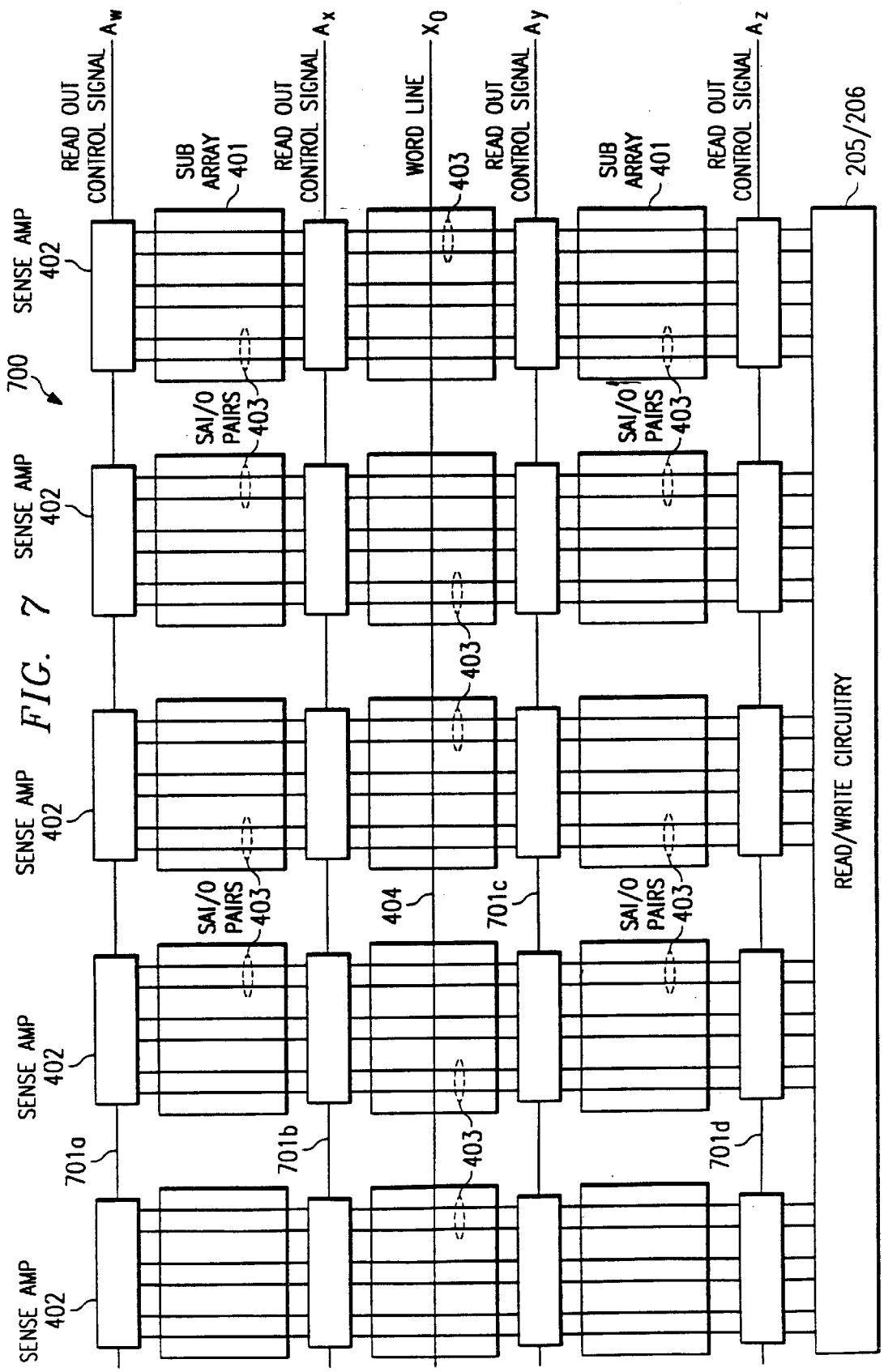
FIG. 7 is a functional block diagram of an alternate embodiment of the principles of the present invention in which the bitlines are used as sense amplifier input/output lines.

In FIG. 7, a single wordline structure 408 is used as was discussed in conjunction with FIG. 4. Additionally, the dual sense amplifier per half-bitline structure of FIG. 4 is also utilized. In this embodiment, control lines such as control lines Aw–Az (701) selectively activate the sense amplifiers along a row of subarrays 401. The bitline pairs 403, coupled in accordance with FIGS. 4 and 5, act as the SAI/O lines themselves, passing data from the selected sense amplifiers 402 to periphery 205/206.

Figure 8:
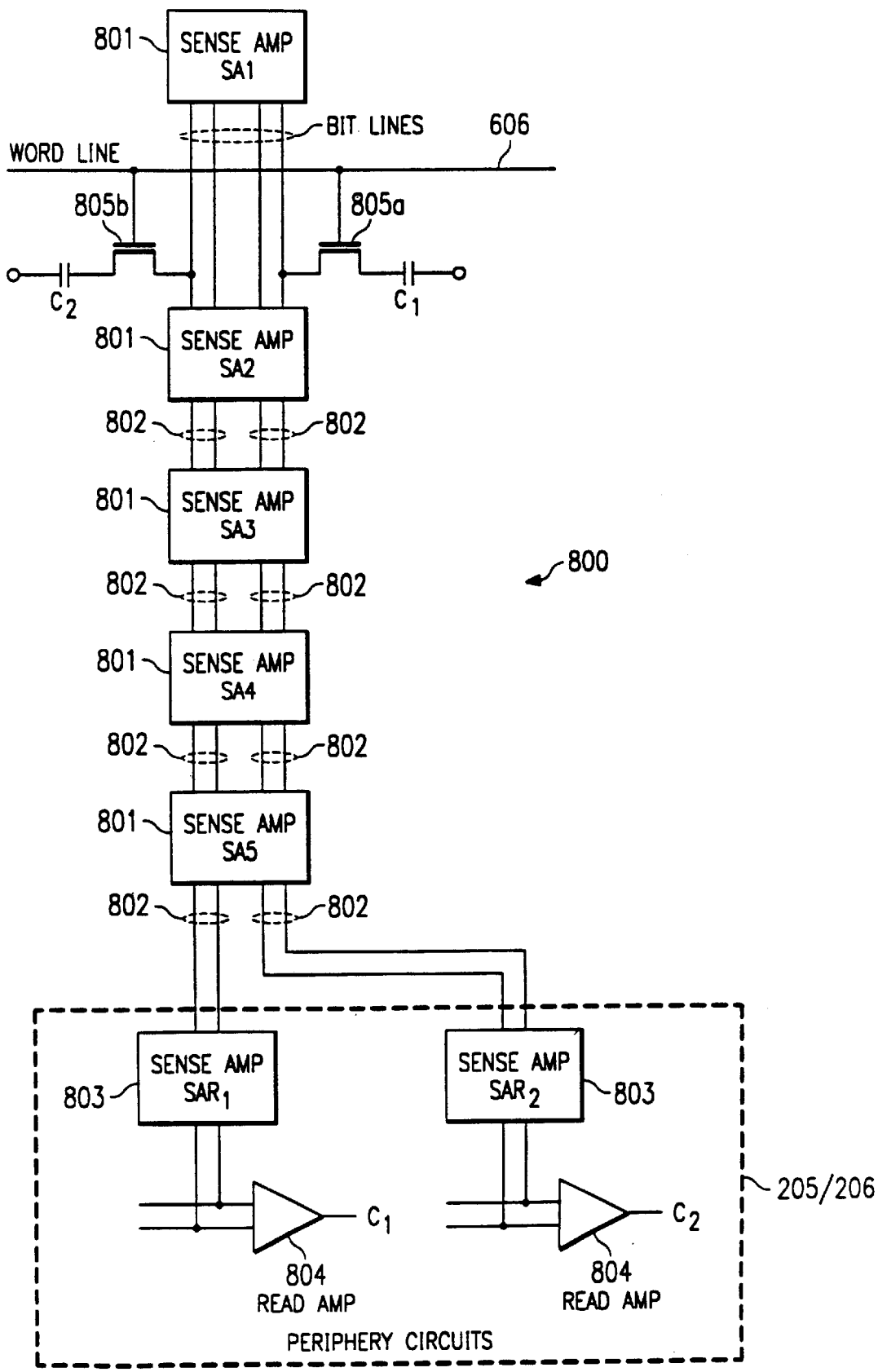
FIG. 8 is a functional block diagram illustrating the approach of utilizing bitlines as sense amplifiers input/output lines in further detail.

FIG. 8 is a detailed illustration of an arrangement in which a single column of sense amplifiers (SA) 801 are coupled together by half-bitline pairs 802 in the manner described above with regards to FIG. 7. A wordline 806 (WL) and a pair of storage cells 807 (C1 and C2) are shown for reference.

With regards to the operation of the architecture of FIG. 8, assume for example that cell (bit) C1 is selected by asserting wordline WL. The data held in cell C1 is sensed and restored by sense amplifier $SA_2$. Next the data is passed from sense amplifier $SA_2$ to $SA_3$ to $SA_4$ and on to $SA_5$. Sense amplifier $SA_5$ then transfers the data to sense amplifier (SAR2) 803 in periphery 205/206. During a read, bit C1 latched in periphery sense amplifier SAR2 is output through an associated read amplifier 804.

Bit C2 is also selected by the assertion of wordline WL and is sensed and restored by sense amplifier $SA_1$. After bit C1 has been transferred to periphery 205/206, bit C2 is transferred in a similar way: from $SA_1$ to $SA_2$ to $SA_3$ to $SA_4$ to $SA_5$ and periphery sense amplifier SAR1. Alternatively, sense amps $SAR_1$ and $SAR_2$ could be eliminated: $SA_5$ would drive the Read Amps (804) directly.

In sum, the data bits are sequentially transmitted (bursted) through the bitlines to the periphery without the need of the SAI/O lines discussed in conjunction with the embodiments described above. The embodiment of FIG. 8 advantageously eliminates the required metal lines during the fabrication of a chip embodying the invention.

Figure 9:
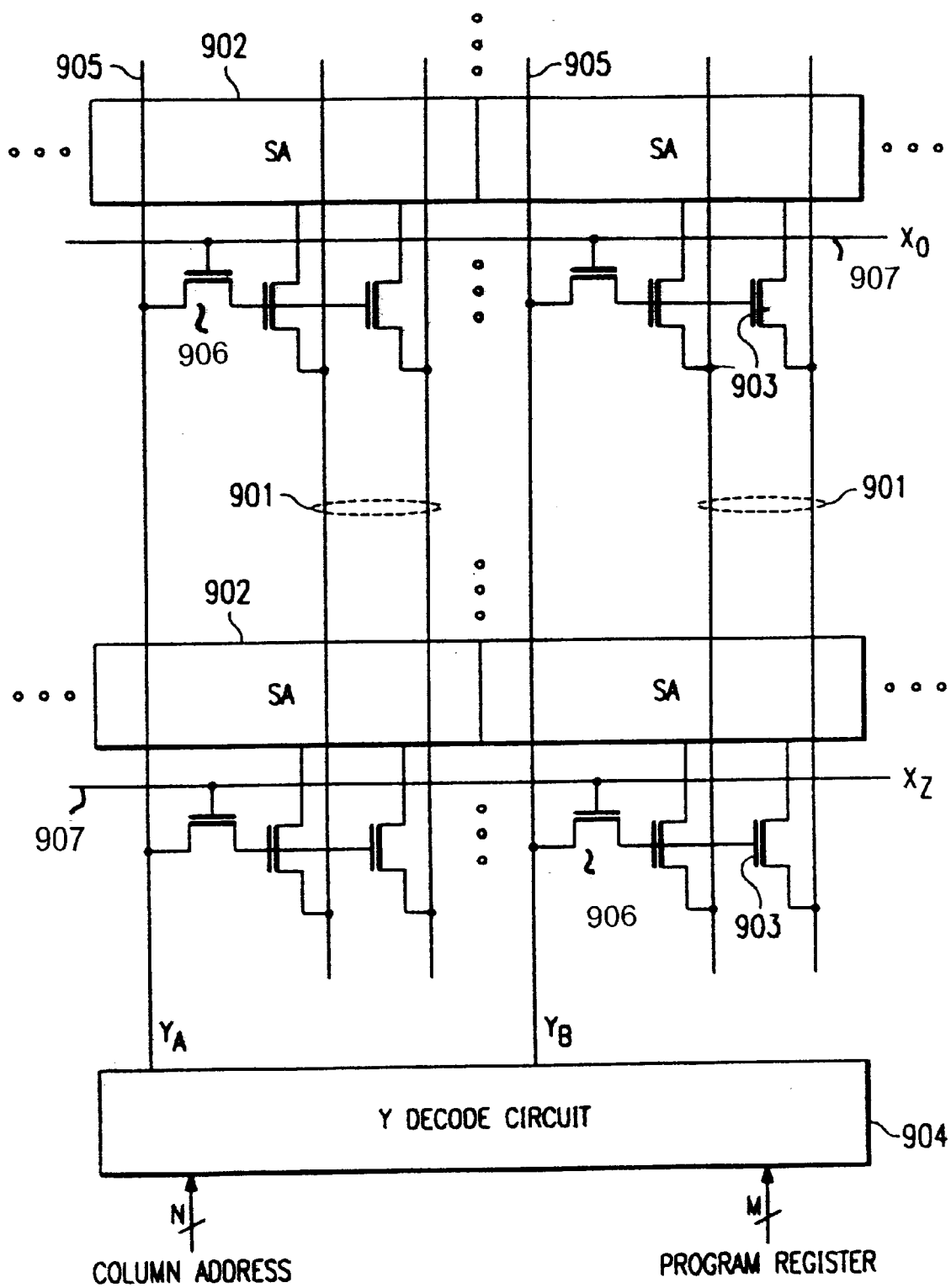
FIG. 9 is a functional block diagram of an alternate embodiment of the principles of the present invention in which each column of sense amplifiers is provided with a dedicated set of input/output lines, and column decode control lines.

FIG. 9 demonstrates a further embodiment of the principles of the present invention. In this embodiment, a dedicated SAI/O (sense amplifier input/output) line pair 901 is provided for each column of sense amplifiers 902. Each I/O line 901 is coupled to the corresponding input/output of each sense amplifier 902 along the column by transistors 903. Transistors 903 are in turn controlled by Y decode circuitry 904 through the column (Y) lines 904 associated and pass transistors 906. The gates of pass transistors 906 are coupled to and controlled by the wordline (X) 907 of a corresponding row of sense amplifiers 902.

An exemplary operation of the embodiment of FIG. 9 is described as follows. As with a conventional DRAM access, a row of cells is selected by activating the corresponding wordline 907. This also turns on transistors 906 for that row. A column address and any bits stored in program register are received and decoded by Y decoder circuit 904. The selected column line or lines couple the output of corresponding sense amplifiers 902 along the selected row to their input/output lines 901 through the associated transistors 903. The column address may select all of the sense amplifiers 902 for the active row, or some subset thereof, including a single sense amplifier. The corresponding I/O lines 901 pass exchange data between the active set of sense amplifiers and the device periphery.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It is therefore, contemplated that the claims will cover any such modifications or embodiments that fall within the true scope of the invention.

What is claimed is:

1. A memory architecture comprising:
    an array of memory cells partitioned into a plurality of subarrays, each subarray comprising:
        a plurality of memory cells organized in rows and columns, each row associated with a conductive wordline and each column associated with a pair of conductive half-bitlines;
        a first sense amplifier selectively coupled to a selected said pair of half-bitlines and to a second pair of half-bitlines of a second subarray by a set of transfer gates;
        a second sense amplifier selectively coupled to said selected said pair of half-bitlines and to a third pair of half-bitlines of a third subarray by a set of transfer gates; and
        a first local I/O line coupled to said first sense amplifier;
        a second local I/O line coupled to said second sense amplifier; and
    first and second sets of global I/O lines, each selectively coupled to said first and second local I/O lines.

2. The memory architecture of claim 1 wherein said first sense amplifier is selectively coupled to said selected pair of half-bitlines by a set of pass gates.

3. The memory architecture of claim 1 wherein said second sense amplifier is selectively coupled to said selected pair of half-bitlines by a set of pass gates.

4. The memory architecture of claim 1 wherein each said set of global I/O lines comprises a pair of global I/O lines.

5. The memory architecture of claim 1 wherein each said local I/O line is selectively coupled to said first and second sets of global I/O lines through a set of pass transistors.

6. The memory architecture of claim 1 and further comprising:
    a third sense amplifier selectively coupled to said second pair of half-bitlines by a set of transfer gates for selectively copying data stored in said first sense amplifier via said second pair of half-bitlines;
    a fourth sense amplifier selectively coupled to said third pair of half-bitlines by a set of transfer gates for selectively copying data stored in said second sense amplifier via said third pair of half-bitlines.

7. The memory architecture of claim 6 and further comprising:
    a third local I/O line for selectively coupling said third sense amplifier to said first and second global I/O lines; and
    a fourth local I/O line for selectively coupling said fourth sense amplifier to said first and second global I/O lines.

8. The memory architecture of claim 7 herein said first, second, third and fourth sense amplifiers are controlled by a common column line.

9. A memory comprising:
    a first memory cell coupled to a wordline and a first bitline;
    a second memory cell coupled to said wordline and a second bitline;
    a first sense amplifier selectively coupled to said first and second bitlines;
    a second sense amplifier selectively coupled to said first and second bitlines;
    a third sense amplifier selectively coupled to said second sense amplifier by a third bitline for copying data received from said second sense amplifier;

a first read amplifier selectively coupled to said third sense amplifier for outputting data transferred from said first memory cell by said second and third sense amplifiers; and a second read amplifier selectively coupled to said third sense amplifier for outputting data transferred from said second memory cell by said first, second and third sense amplifiers.

10. The memory of claim 9 wherein said first and second bitlines form a part of a first subarray of memory cells.

11. The memory of claim 9 wherein said third and fourth bitlines form a part of a second subarray of memory cells.

12. The memory of claim 9 wherein said memory cells comprises dynamic random access memory cells.

13. A memory comprising:

an array of rows and columns of subarrays, each said subarray comprising a plurality of rows and columns of memory cells, each said column of cells associated with a bitline and each said bitline associated with first and second sense amplifiers on corresponding sides;

circuitry for selectively coupling said bitline of a first selected subarray of a selected column of subarrays to peripheral circuitry through said bitlines of second and third subarrays of said selected column of subarrays comprising:

first switching circuitry for selectively coupling said second sense amplifiers associated with to said bitlines of said first subarray to said bitlines of said second subarray; and second switching circuitry for selectively coupling said second sense amplifiers associated with said bitlines of said second subarray to said bitlines of said third subarray; and circuitry for selectively activating a set of said second sense amplifiers selectively coupled to said bitlines of said first subarray and a set of said second sense amplifiers selectively coupled to said bitlines of said second subarray.

14. The memory of claim 13 wherein said circuitry for selectively coupling comprises a plurality of pass transistors.

15. The memory of claim 13 wherein said first and second sense amplifiers of each said subarray are respectively activated by first and second control signals.

16. A memory comprising:

an array of rows and columns of sense amplifiers, said sense amplifiers of a first said row for selectively coupling to a first side of a set of bitlines along a selected said column and said sense amplifiers of a second said row for selectively coupling to a second side of said set of bitlines along said selected column;

first switching circuitry for selectively coupling an I/O port of a selected said sense amplifier of said selected column of sense amplifiers with an I/O line in response to a control signal; and second switching circuitry for selectively coupling said control signal from a column line to said first switching circuitry.

17. The memory of claim 16 wherein said circuitry for selectively coupling said I/O port to said I/O line comprises a pass transistor controlled by said control signal.

18. The memory of claim 17 wherein said circuitry for selectively coupling said control signal from said column line to said circuitry for selectively coupling said I/O port to said I/O line comprises a pass transistor controlled by a row select signal.

* * * * *